US010699902B2

(12) United States Patent
Reboud et al.

(10) Patent No.: US 10,699,902 B2
(45) Date of Patent: Jun. 30, 2020

(54) PROCESS FOR PRODUCING A STRAINED LAYER BASED ON GERMANIUM-TIN

(71) Applicant: COMMISSARIAT A L'ENERGIE ATOMIQUE ET AUX ENERGIES ALTERNATIVES, Paris (FR)

(72) Inventors: Vincent Reboud, Paris (FR); Jean-Michel Hartmann, Montbonnot-Saint-Martin (FR); Alexei Tchelnokov, Meylan (FR); Vincent Calvo, Fontaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/327,520

(22) PCT Filed: Aug. 23, 2017

(86) PCT No.: PCT/FR2017/052261
§ 371 (c)(1),
(2) Date: Feb. 22, 2019

(87) PCT Pub. No.: WO2018/037189
PCT Pub. Date: Mar. 1, 2018

(65) Prior Publication Data
US 2019/0244813 A1    Aug. 8, 2019

(30) Foreign Application Priority Data
Aug. 26, 2016    (FR) ..................... 16 57987

(51) Int. Cl.
*H01L 21/02*        (2006.01)
*H01L 21/28*        (2006.01)
(Continued)

(52) U.S. Cl.
CPC .... *H01L 21/02384* (2013.01); *H01L 21/0223* (2013.01); *H01L 21/02236* (2013.01);
(Continued)

(58) Field of Classification Search
CPC ......... H01L 21/02104; H01L 21/02164; H01L 21/0223; H01L 21/02247; H01L 21/02535;
(Continued)

(56) References Cited

U.S. PATENT DOCUMENTS

| 2015/0102465 A1 | 4/2015 | Chen et al. |
| 2015/0372454 A1 | 12/2015 | Guilloy et al. |
| 2017/0092809 A1 | 3/2017 | Reboud et al. |

FOREIGN PATENT DOCUMENTS

EP    3 151 266 A1    4/2017

OTHER PUBLICATIONS

International Search Report dated Nov. 3, 2017 in PCT/FR2017/052261 filed on Aug. 23, 2017.
Matthews, J. W. et al., "Defects in Epitaxial Multilayers," Journal of Crystal Growth, vol. 27, 1974, pp. 118-125.
(Continued)

*Primary Examiner* — Eduardo A Rodela
(74) *Attorney, Agent, or Firm* — Oblon, McClelland, Maier & Neustadt, L.L.P.

(57) ABSTRACT

The invention pertains to a process for producing a strained layer based on germanium-tin (GeSn). The process includes a step of producing a semiconductor stack containing a layer based on GeSn and having an initial strain value that is non-zero; a step of structuring the semiconductor stack so as to form a structured portion and a peripheral portion, the structured portion including a central section linked to the peripheral portion by at least two lateral sections having an average width greater than an average width of the central section; and a step of suspending the structured portion, the central section then having a final strain value higher than the initial value.

14 Claims, 9 Drawing Sheets

(51) Int. Cl.
    *H01L 29/78*        (2006.01)
    *H01L 33/00*        (2010.01)
(52) U.S. Cl.
    CPC .. *H01L 21/02373* (2013.01); *H01L 21/02381* (2013.01); *H01L 21/02524* (2013.01); *H01L 21/02532* (2013.01); *H01L 21/02535* (2013.01); *H01L 21/02664* (2013.01); *H01L 21/28229* (2013.01); *H01L 21/28238* (2013.01); *H01L 29/7842* (2013.01); *H01L 29/7847* (2013.01); *H01L 33/005* (2013.01)
(58) Field of Classification Search
    CPC ......... H01L 21/02521; H01L 21/02532; H01L 21/02664; H01L 29/1054; H01L 29/7842; H01L 29/7843; H01L 29/7849
    See application file for complete search history.

(56)         References Cited

OTHER PUBLICATIONS

Maree, P. M. J. et al., "Generation of misfit dislocations in semiconductors," Journal of Applied Physics, vol. 62, No. 11, Dec. 1987, pp. 4413-4420 (9 total pages).
Wirths, S. et al., "Lasing in direct-bandgap GeSn alloy grown on Si," Nature Photonics, vol. 9, Feb. 2015, pp. 88-92.
Wirths, S. et al., "Strain Engineering for Direct Bandgap GeSn Alloys," IEEE, 2014, pp. 13-14.
Suess, M. J. et al., "Analysis of enhanced light emission from highly strained germanium microbridges," Nature Photonics, vol. 7, Jun. 2013, pp. 466-472.
Nam, D. et al., "Strain-Induced Pseudoheterostructure Nanowires Confining Carriers at Room Temperature with Nanoscale-Tunable Band Profiles," Nano Letters, vol. 13, Jun. 2013, pp. 3118-3123.

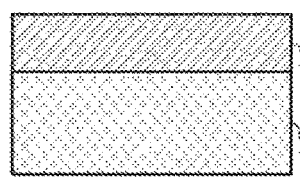
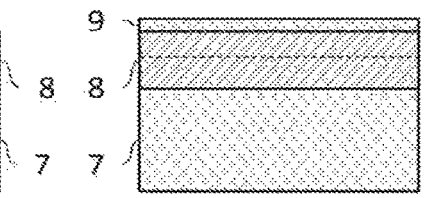
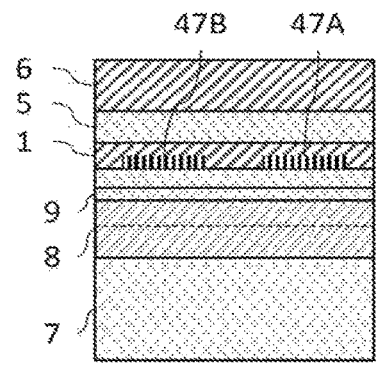
Fig.9A  Fig.9B  Fig.9C
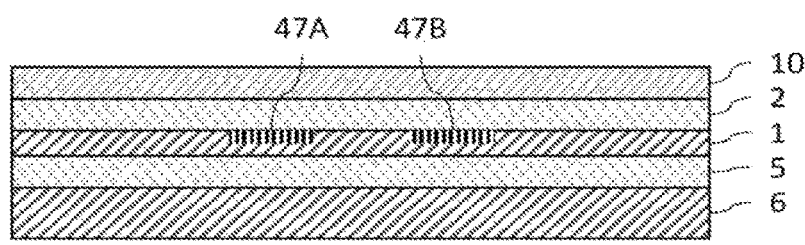
Fig.9D
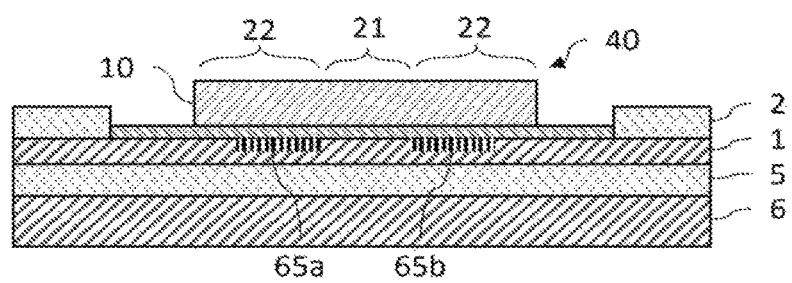
Fig.9E
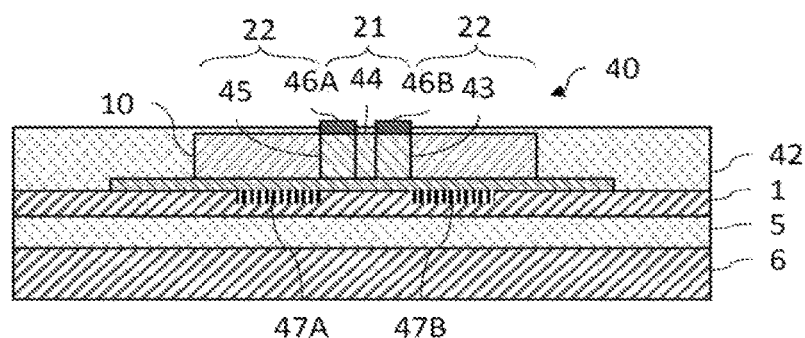
Fig.9F

PROCESS FOR PRODUCING A STRAINED LAYER BASED ON GERMANIUM-TIN

TECHNICAL FIELD

The field of the invention is that of the production of a tensionally strained layer based on germanium-tin GeSn, with the aim notably of obtaining a direct electronic band structure. The invention applies in particular to the production of a microelectronic or optoelectronic device comprising a tensionally strained layer of this kind based on GeSn.

PRIOR ART

In various microelectronic or optoelectronic applications, it may be advantageous to use a tensionally strained layer produced on the basis of germanium-tin. This is notably the case with high-performance transistors, where the strain that the material undergoes is reflected in an increase in the speed of displacement of the charge carriers, which improves the performance of a transistor of this kind. It is also the case with light sources such as electrically pumped lasers, for which the emitting layer based on germanium-tin may have a direct electronic band structure by applying a sufficient strain value.

The article by Wirths et al. entitled *Tensely strained GeSn alloy as optical gain media*, Appl. Phys. Lett. 103, 192110 (2013) describes an example of a process for producing a tensionally strained layer based on germanium-tin. This process comprises growth of an intermediate thick layer of $Ge_{1-y}Sn_y$, partially or fully relaxed, on a germanium nucleation layer, then growth of a so-called thin layer of $Ge_{1-x}Sn_x$ of interest on the intermediate layer, the atomic proportion of tin $x_{Sn}$ being less than that $y_{Sn}$ of the intermediate layer. The intermediate layer is said to be thick, in the sense that its thickness is greater than the critical thickness, starting from which the mechanical stresses to which the layer is subjected relax plastically. The intermediate thick layer of $Ge_{1-y}Sn_y$ has, at the level of its upper surface, a lattice parameter greater than that of the layer of $Ge_{1-x}Sn_x$ of interest, which makes it possible to strain the layer of interest. In this configuration, it is expected that a thin layer of $Ge_{1-x}Sn_x$ will have a direct electronic band structure when $x_{Sn}$ is less than 10% and when $y_{Sn}$ is greater than or equal to 12%. The authors effectively obtain a thin layer with a direct electronic band structure for $x_{Sn}$=8% and $y_{Sn}$=12%.

However, this production process requires the fabrication of an intermediate layer with a high atomic proportion of tin for straining the $Ge_{1-x}Sn_x$ layer of interest. Now, said layer with a high atomic proportion of tin and with good crystal quality is particularly difficult to produce, on the one hand because of the large difference between the lattice parameter of germanium ($a_{Ge}$=5.658 Å) and that of tin ($a_{Sn}$=6.489 Å), and on the other hand because of the difference between the melting point of germanium (about 950° C.) and that of tin (about 240° C.), which may lead to demixing of the tin.

DISCLOSURE OF THE INVENTION

The invention aims to remedy the drawbacks of the prior art, at least partly, and more particularly proposes a process for producing a so-called tensionally strained layer of interest, based on germanium-tin, not requiring production of an intermediate layer based on germanium-tin with a high proportion of tin. For this purpose, the invention relates to a process for producing a tensionally strained layer based on germanium-tin, comprising the following steps:

producing a semiconductor stack resting on a supporting layer via a sacrificial layer, said semiconductor stack comprising a nucleation layer and a so-called layer of interest based on germanium-tin grown epitaxially starting from the nucleation layer, said stack having a non-zero initial strain value;

structuring said semiconductor stack so as to form:
a structured part and a peripheral part, the structured part comprising a central portion joined to the peripheral part by at least two lateral portions opposite one another with respect to the central portion, the lateral portions having an average width greater than an average width of the central portion;

suspending the structured part by etching the sacrificial layer located beneath the structured part, the so-called suspended central portion then having a final strain value greater than the initial value.

Certain preferred but non-limiting aspects of this process are as follows.

The process may comprise the following steps:
prior to the production step a), estimating a value of atomic proportion of tin and of a first minimum strain value for which the layer of interest has a direct electronic band structure; and
determining a semiconductor stack comprising a nucleation layer and said estimated layer of interest, and having a second minimum strain value;
producing said semiconductor stack in such a way that it has said non-zero initial strain value and so that the layer of interest has an initial value lower than said first minimum value;
determining the structuring in such a way that, after the step of suspension, the central portion of the structured part has a final strain value greater than or equal to said second minimum value, said layer of interest then having a final strain value greater than or equal to said first minimum value and then having a direct electronic band structure.

The nucleation layer may be made of a semiconductor compound having a so-called natural lattice parameter lower than that of the material based on germanium-tin of the layer of interest.

The semiconductor stack may comprise at least one layer located between the layer of interest and the nucleation layer made of a semiconductor compound having a so-called natural lattice parameter less than or equal to that of the material based on germanium-tin of the layer of interest.

The semiconductor stack may have a thickness less than a so-called critical thickness.

Each layer of the semiconductor stack may have a thickness less than a so-called critical thickness.

The semiconductor stack may comprise upper and lower layers based on germanium-tin, doped according to different types of conductivity, located on either side of the layer of interest, the latter not being doped intentionally.

Between the upper and lower doped layers on the one hand and the layer of interest on the other hand, there may be at least one so-called barrier layer based on germanium, or based on germanium-tin for which the atomic proportion of tin is lower than the value of the atomic proportion of tin in the layer of interest.

The process may comprise a step of partial etching of the nucleation layer, this etching being selective with respect to the layer of interest, so as to remove the nucleation layer at the level of the central portion and preserve at least one part thereof at the level of the lateral portions.

The atomic proportion of tin in the layer of interest may be less than 10%.

The process may further comprise a step of contacting the structured part with a surface freed from the supporting layer, so as to make the structured part of the supporting layer integral by molecular bonding.

The process may further comprise the following steps:

determining a minimum value of energy of molecular bonding of the structured part on the supporting layer, as well as a minimum value of bonded surface area of the lateral portions, these minimum values being such that said energy of molecular bonding is greater than an elastic energy of the structured part;

consolidation annealing at an annealing temperature such that the energy of molecular bonding has a value greater than or equal to said previously determined minimum value; and then etching a so-called distal part of the lateral portions with respect to the central portion, in such a way that the bonded surface of the lateral portions has a value greater than or equal to said previously determined minimum value.

The suspension step and the contacting step may be carried out by etching the sacrificial layer with HF in the vapor phase optionally followed by deposition and then evaporation of a liquid between the suspended structured part and the supporting layer, and in which, in the annealing step, the annealing temperature is greater than or equal to 200° C.

The process may comprise, in the suspension step, oxidation or nitriding of a freed surface of the supporting layer as well as of a lower surface of the structured part oriented towards the free surface, and in which, in the annealing step, the annealing temperature is greater than or equal to 100° C.

Following the suspension step, dielectric layers, resulting from the oxidation or nitriding carried out, may be formed at the level of the structured part and of the supporting layer, which have a thickness preferably greater than or equal to 10 nm.

The invention also relates to a process for producing a microelectronic or optoelectronic device comprising said layer of interest based on germanium-tin obtained by the process according to any one of the preceding features, in which a PN junction is produced in the layer of interest, or a p-i-n junction at the level of said layer of interest, the latter then not being doped intentionally.

BRIEF DESCRIPTION OF THE DRAWINGS

Other aspects, aims, advantages and features of the invention will become clearer on reading the following detailed description of preferred embodiments of the invention, given as non-limiting examples, and referring to the appended drawings, where:

FIGS. 9A to 9F represent, schematically and in section, different steps of an example of a process for producing a laser source comprising a semiconductor stack obtained by the process according to the first or the second embodiment.

DETAILED ACCOUNT OF PARTICULAR EMBODIMENTS

In the figures and in the rest of the description, the same references represent elements that are identical or similar. Moreover, the different elements are not shown to scale, for the sake of clarity of the figures. Moreover, the various embodiments and variants are not exclusive of one another and may be combined with one another. Unless stated otherwise, the terms "approximately", "about", "of the order of" signify to within 10%.

The invention relates in general to a process for producing a so-called layer of interest based on tensionally strained germanium-tin, notably with the aim of obtaining a direct electronic band structure.

"Strained layer" means a layer made of a single-crystal semiconductor material having mechanical strain in tension or in compression, leading to distortion of the unit cells of the crystal lattice of the material. The layer is tensionally strained when it is subjected to a mechanical strain that tends to stretch the cells of the lattice in a plane. This is then reflected in the presence of a compressive strain oriented along an axis approximately orthogonal to the plane of stretching. In the context of the invention, the layer of interest based on germanium-tin is intended to be tensionally strained in the plane of the layer, which is reflected in the fact that its lattice parameter has a so-called effective value greater than its so-called natural value when the material is relaxed, i.e. not strained. In the rest of the description, unless stated otherwise, the strain in question is oriented in the plane of the layer.

"Layer of interest based on germanium-tin GeSn" means that the layer of interest is made of an alloy $Ge_{1-x}Sn_x$ comprising germanium and tin. The germanium-tin alloy may be a binary alloy $Ge_{1-x}Sn_x$, ternary, for example $Si_yGe_{1-x-y}Sn_x$, or even quaternary or more. The atomic proportion of tin in the alloy is designated $X_{Sn}$. The layer of interest based on germanium-tin is preferably formed of an alloy that is homogeneous in terms of the atomic proportions of the elements forming the alloy and in terms of the values of any optional doping.

"Direct or approximately direct electronic band structure" means that the minimum energy of the valley L (or indirect valley) is greater than or approximately equal to the minimum energy of the valley Γ (or direct valley) of the conduction band, in other words: $\Delta E = E_{min,L} - E_{min,\Gamma} \geq 0$. Here, "approximately equal" means that this energy difference is of the order of magnitude of or less than kT, where k is the Boltzmann constant and T is the temperature of the material. In the context of the invention, initially the layer of interest is produced on the basis of germanium-tin, the energy band structure of which is indirect when the material is not tensionally strained sufficiently, in other words $\Delta E < 0$, and may then have tensile strain sufficient to make its band structure direct.

Figure 1A:
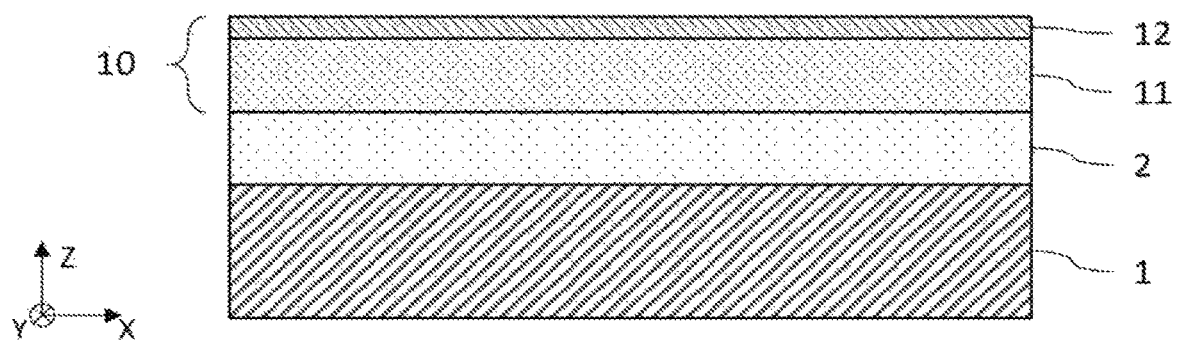
FIGS. 1A, 1B and 1C are schematic views, in section (FIG. 1A and 1C) and from above (FIG. 1B), of a stack comprising a layer of interest based on germanium-tin, for different steps of a process according to a first embodiment.
Figure 1B:
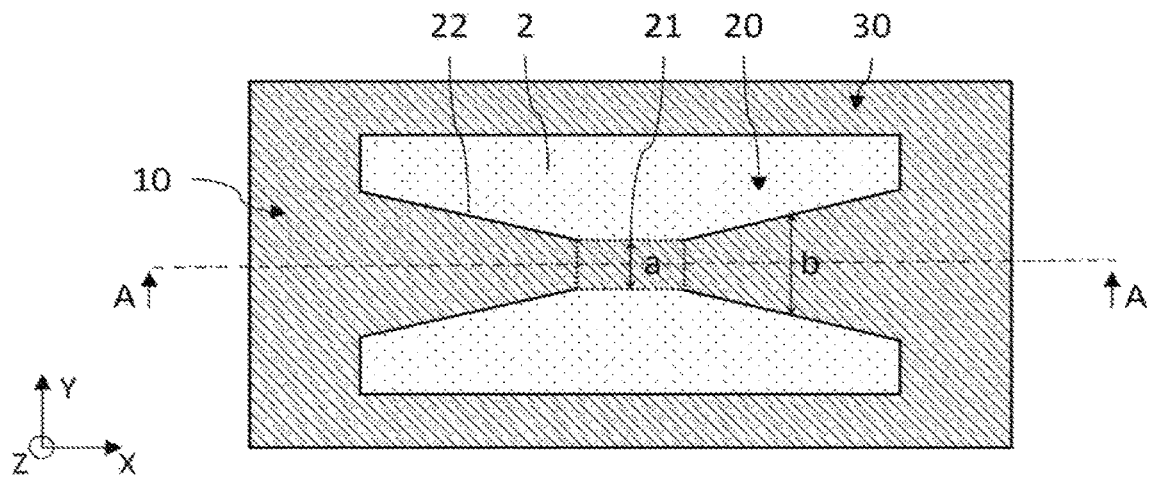
Figure 1C:
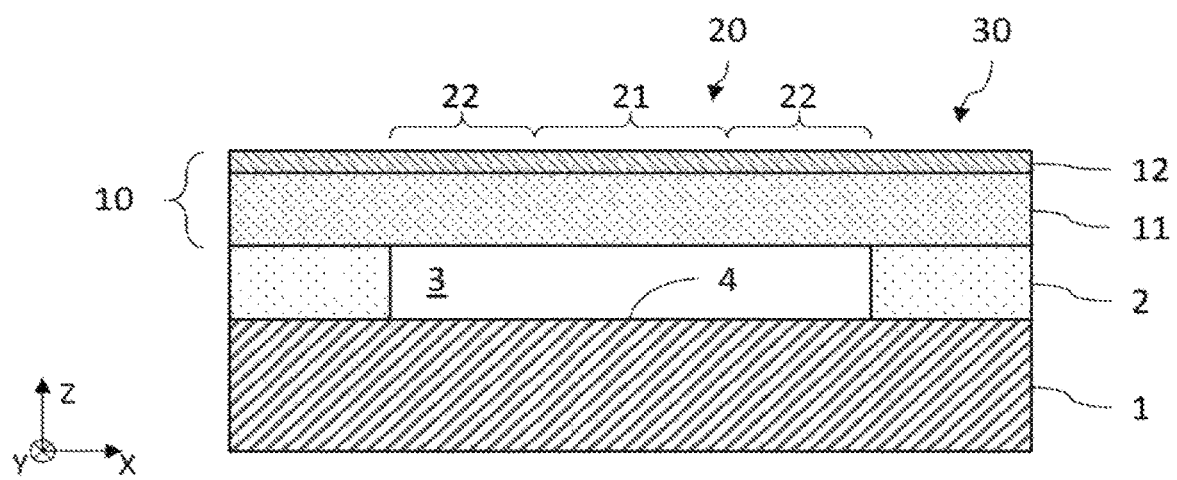

FIGS. 1A, 1B and 1C illustrate different steps of a process for producing the layer of interest based on tensionally strained germanium-tin, according to a first embodiment.

Here, and for the rest of the description, a direct three-dimensional coordinate system is defined (X,Y,Z), where the X and Y axes form a plane parallel to the plane of a supporting layer, and where the Z axis is oriented along the thickness of the layers. In the rest of the description, the terms "vertical" and "vertically" are understood as relating to an orientation approximately parallel to the Z axis. Moreover, the terms "lower" and "upper" are understood as relating to an increasing position as we move away from the supporting layer in the +Z direction.

Referring to FIG. 1A, a semiconductor stack 10 is produced comprising semiconductor layers, including at least one nucleation layer 11 and the layer of interest 12 based on germanium-tin, here made of germanium-tin binary alloy $Ge_{1-x}Sn_x$, the latter being grown epitaxially starting from the nucleation layer 11. The semiconductor stack 10 covers a sacrificial layer 2 resting on a supporting layer 1.

The supporting layer 1 may be made of a semiconducting, electrically conducting or dielectric material. This material may have a thickness of the order of some tens of nanometers to some hundreds of microns, for example may be between 10 nm and 700 μm, or even between 500 nm and 100 μm. It is made of silicon here, but it may be selected more generally from, among others, silicon, sapphire, borosilicate, silica, glass, quartz.

The sacrificial layer 2 may be made of a material that is etchable selectively relative to the material of the supporting layer 1 and the materials of the semiconductor stack 10. It may be a silicon oxide (for example $SiO_2$) or a silicon nitride (for example $Si_3N_4$). The sacrificial layer 2 may have a thickness of the order of some tens of nanometers to some microns, for example between 10 nm and 10 μm, or even between 500 nm and 5 μm. It is made of silicon dioxide $SiO_2$ here.

The nucleation layer 11 may be made of a single-crystal semiconductor material suitable for nucleation, or germination, of the layer of interest 12 based on GeSn. The material of the nucleation layer 11 may be selected from the elements or compounds of column IV of the periodic table, such as germanium, silicon, tin, and the alloys formed from these elements such as GeSn, SiGeSn, SiGe. It may also be selected from the compounds comprising elements of columns III and V, such as GaP, AlP AlAs, INGaAs, InP, AlGaAs, or even from the compounds comprising elements of columns II and VI, such as ZnS, ZnSe, CdZnTe, CdTe.

The layer of interest 12 is made of a single-crystal semiconductor material based on germanium-tin, and is made of a germanium-tin binary alloy $Ge_{1-x}Sn_x$ here. The atomic proportion of tin $X_{Sn}$ is non-zero and may be between 1% and 14%, preferably between 4% and 10%. It has a thickness of the order of some tens of nanometres to some hundreds of nanometres or even to some microns, for example between 10 nm and 1 μm.

Preferably, each of the layers forming the semiconductor stack 10 has a thickness less than its so-called critical thickness starting from which the stresses to which the layer is subjected may relax and cause structural defects to develop, for example lattice mismatch dislocations, then leading to potential degradation of the electronic and/or optical properties of the layer. Also preferably, the thickness of the semiconductor stack 10 is less than its critical thickness. This minimizes the degradation of the crystal quality of the semiconductor stack 10 and of the layers from which it is formed.

According to one embodiment, the nucleation layer 11 may be made of a material having a lattice parameter less than that of the layer of interest 12. This is notably the case with germanium Ge, and with a germanium-tin alloy with an atomic proportion of tin less than that of the layer of interest 12. Thus, the layer of interest 12 may have a compressive strain with respect to the nucleation layer 11, notably when it is in contact with the nucleation layer 11 or when an intermediate layer of the same material as the layer of interest 12 is located between the latter and the nucleation layer 11. The nucleation layer 11 preferably has a thickness greater than that of the layer of interest 12.

According to another embodiment, the nucleation layer 11 may be made of a material having a lattice parameter greater than that of the layer of interest 12. This is notably the case with tin and with a germanium-tin alloy with an atomic proportion of tin greater than that of the layer of interest 12. Thus, the layer of interest 12 may be tensionally strained with respect to the nucleation layer 11. The nucleation layer 11 preferably has a thickness less than that of the layer of interest 12.

In the context of the invention, the semiconductor stack 10 is produced in such a way that it has a non-zero tensile strain, i.e. the strain of the stack, in the (X,Y) plane, has a non-zero, positive initial value $\sigma_s^i$. The strain of the stack 10 corresponds to the mean value of the strains of each layer of the stack, according to the relation:

$$\sigma_s = \Sigma_{k=1}^N E_k \varepsilon_k e_k$$

where $E_k$ is the Young's modulus of the layer k belonging to the stack, of thickness $e_k$, and $\varepsilon_k$ is the value of the deformation that the layer k undergoes.

For this, the materials of the layers and their thicknesses are selected in such a way that the strain of the stack 10 in the (X,Y) plane is strictly positive, in other words in such a way that the stress $\sigma_{s,z}^i$ along the Z axis is either in compression, and therefore negative, according to the following relation (1):

$$\sigma_{s,z}^i = \Sigma_{k=1}^N E_k \varepsilon_{k,z}^i e_k < 0 \qquad (1)$$

where $\varepsilon_{k,z}^i$ is the initial value of the deformation along the Z axis that the layer k undergoes. This initial value $\varepsilon_{k,z}^i$ of the deformation may be estimated conventionally from the lattice parameter $a_{o,k}$ of the relaxed layer k and the lattice parameter $a_{z,k}$ of the strained layer k from the relation $\varepsilon_{k,z}^i = (a_{z,k} - a_{o,k})/a_{o,k}$. It may also be estimated conventionally from the stiffness constants of the layer k and the deformation in the (X,Y) plane that the layer k undergoes.

As an example, the nucleation layer 11 may be a layer of germanium deposited or transferred onto a sacrificial layer 2 of silicon oxide resting on a supporting layer 1 of silicon. This assembly of layers is preferably produced by the process described in the work of Reboud et al. titled *Structural and optical properties of 200 mm germanium-on-insulator (GeOI) substrates for silicon photonics applica-*

*tions*, Proc. SPIE 9367, Silicon Photonics X, 936714 (Feb. 27, 2015), which notably employs the Smart Cut™ technology.

For this, firstly a layer of crystalline germanium is grown epitaxially on a thick layer of silicon. The layer of germanium then has, at room temperature, a residual tensile strain of the order of 0.2%. Then a dielectric layer, for example a silicon oxide, is deposited on the free surface of the layer of germanium, and then implantation of H$^+$ ions in the layer of germanium is carried out. Next, the dielectric layer covering the layer of germanium is made integral with a handle substrate formed from a dielectric layer covering a layer of silicon. The layer of germanium is separated into two parts at the level of a zone weakened by ion implantation. This results in a layer of single-crystal germanium 11 covering a sacrificial layer 2, in this case of silicon oxide, which rests on a supporting layer 1, for example a layer of silicon of a SOI substrate. This process is advantageous in that the crystal quality of the nucleation layer 11 is particularly high and approximately homogeneous through the thickness of the layer. As an example, the dislocation density may be below $10^7$ cm$^{-2}$ over the entire thickness of the layer, in particular at the interface with the sacrificial layer 2.

A tensionally strained germanium nucleation layer 11 is thus obtained. Owing to the difference in values between the coefficients of thermal expansion of germanium and silicon, after cooling to room temperature, the nucleation layer undergoes tensile strain in the (X,Y) plane of the order of 0.2%, which is reflected in an effective lattice parameter of about 5.670 Å whereas the natural lattice parameter of relaxed germanium is 5.658 Å.

Alternatively, the tensionally strained nucleation layer 11 may be produced by epitaxial growth of a layer of germanium on a substrate, the layer of germanium then being covered with a layer of silicon oxide. This stack is made integral by molecular bonding with a second stack formed from a layer of silicon covered with a layer of silicon oxide, bonding being effected by bringing the layers of silicon oxides into contact with one another. Then the substrate is removed completely, for example by grinding, thus obtaining the layer of germanium bound to a supporting layer 1 of silicon by a sacrificial layer 2 of silicon oxide. This approach is notably described in the work of Jan et al'. titled *Tensile-strained germanium-on-insulator substrate for silicon-compatible optoelectronics,* Opt. Mater. Express 1, 1121-1126 (2011).

The layer of interest 12 based on GeSn is then grown epitaxially starting from the exposed surface of the nucleation layer 11, for example by a technique of chemical vapor deposition (CVD), optionally at low pressure (low-pressure chemical vapor deposition, LPCVD) or else by molecular beam epitaxy (MBE).

The ratios of the flows of the precursor gases, for example $Ge_2H_6$ and $SnCl_4$, are controlled to obtain the value $x_{Sn}$ of atomic proportion of tin in the layer of interest 12. As an illustration, the temperature of growth may be between 300° C. and 400° C. and the rate of growth may be of the order of 10 nm/min to 100 nm/min. The layer of interest 12 then has a compressive strain in the (X,Y) plane as it has a natural lattice parameter greater than the effective lattice parameter of the nucleation layer 11.

The thicknesses of the nucleation layer 11 and of the layer of interest 12 are selected using relation (1) so that the semiconductor stack 10 has a tensile stress $\sigma_s^i > 0$ in the (X,Y) plane, in other words a compressive stress $\sigma_{s,z}^i > 0$ along the Z axis.

As an illustration, we may thus obtain a semiconductor stack 10 tensionally strained in the (X,Y) plane, and formed of:

the nucleation layer 11 of germanium with a thickness of for example 1 µm, having a tensile strain of +0.2% (effective lattice parameter of 5.670 Å against a natural lattice parameter of 5.658 Å), and the layer of interest 12 of $Ge_{1-x}Sn_x$ with an atomic proportion of tin $x_{Sn}$ of 8%, with a thickness of for example 50 nm. The layer of interest 12 thus has an effective lattice parameter of 5.670 Å, equal to that of the nucleation layer 11, against a natural lattice parameter of 5.724 Å. It then has a compressive strain in the (X,Y) plane of −0.94%.

Referring to FIG. 1B, structuring of the semiconductor stack 10 is carried out so as to form a structured part 20 and a peripheral part 30, the structured part 20 comprising a central portion 21 joined to the peripheral part 30 by at least two lateral portions 22 opposite one another with respect to the central portion 21. Here, the structured part 20 comprises a single pair of tensioning arms 22 intended to ensure a subsequent increase in the uniaxial tensile stress of the central portion 21, and therefore tensile stressing of the layer of interest 12 located in the central portion 21. The structured part 20 is produced by conventional steps of optical and/or electronic lithography and then etching of the stack, which therefore are not described in detail here.

The central portion 21 may have an approximately square or rectangular shape, in the (X,Y) plane, from some hundreds of nanometers to some microns in width, and from some hundreds of nanometers to some hundreds of microns in length. Other shapes are possible, such as polygonal shapes. The lateral portions 22, called tensioning arms 22 hereinafter, each connect an edge of the central portion 21 to the peripheral part 30. They are arranged in pairs with respect to the central portion 21 so as to define at least one approximately rectilinear strain axis. Thus, an increase in tensile strain can be generated in the central portion 21 in the subsequent step of suspension of the structured part 20, and therefore tensile stressing of the layer of interest 12 located in the central portion 21.

For this, the tensioning arms 22 and the central portion 21 are formed so that the average width "b" of the tensioning arms 22 is greater than the average width "a" of the central portion 21, preferably ten times greater than the latter. "Width" means the transverse dimension of a portion or of an arm, in the (X,Y) plane, to its longitudinal axis. Here, the central portion 21 has an average width "a" oriented along the Y axis and approximately constant along the longitudinal axis X. The tensioning arms 22 have an average width "b" oriented here along the Y axis.

Furthermore, the surface dimension in the (X,Y) plane is selected in such a way that the tensioning arms 22 have little or no strain at the end of the subsequent step of suspension. More precisely, the local strain decreases with increasing distance from the central portion 21 and becomes negligible at a distance greater than or equal to one or two times a mean dimension of the central portion 21. The mean strain of the tensioning arms 22, i.e. the strain field integrated in the volume of the tensioning arms 22, has a value lower than that of the central portion 21, or even is negligible with respect to the mean strain in the central portion 21. For the example in FIG. 1B, the tensioning arms 22 have a trapezium shape so that the width increases with increasing distance from the central portion 21. Other shapes are possible, for example a shape where the tensioning arms 22 have an abrupt increase in width with respect to the central portion 21 and then a principal zone with constant width.

The structuring may be carried out so as to control the value of the amplification of the tensile stress of the central portion 21 of the semiconductor stack 10, obtained subsequently during suspension of the structured part 20. For this, the dimensional parameters of the structured part 20 are predetermined, for example the widths and lengths of the central portion 21 and of the tensioning arms 22. As an example, in the case of a rectangular central portion 21, of length A and constant width a, and rectangular tensioning arms 22 of length B/2-A/2 and of constant width b, an amplification factor f linking the final tensile stress $\sigma_s^f$ with the initial tensile stress $\sigma_s^i$ may be expressed by relation (2) formulated in the article by Süess et al. titled *Analysis of enhanced light emission from highly strained germanium microbridges*, Nature Photon. 7, 466-472 (2013):

$$f = \frac{2L+B}{B}\left(1 + \frac{A}{B-A}\right) / \left(\frac{a}{b} + \frac{A}{B-A}\right) \quad (2)$$

where L is the length of the sacrificial layer 2 removed under the structured part 20 in the subsequent step of suspension. Thus, depending on the dimensional parameters of the structured part 20 of the semiconductor stack 10, it is possible to control the value of the amplification of the tensile stress applied to the central portion 21 during suspension. The amplification factor may also be estimated using numerical simulation software such as COMSOL Multiphysics.

Referring to FIG. 1C (sectional view along line AA shown in FIG. 1B), suspension of the structured part 20 is carried out, which will cause amplification of the tensile stress on the central portion 21 of the semiconductor stack 10, and therefore tensile stressing of the layer of interest 12 located in the central portion 21. For this, a cavity 3 is made under the structured part 20 so as to suspend it above a freed surface 4 of the supporting layer 1.

The cavity 3 is made by etching, for example by wet etching, of the sacrificial layer 2 made accessible by openings obtained during the structuring of the semiconductor stack 10. Here, wet etching uses hydrofluoric acid (also called HF, for hydrogen fluoride) in the vapor phase. The flow of HF vapor may be low so as to etch the sacrificial layer 2 at a moderate rate of the order of 10 nm per minute. More precisely, the flow of vapor may, as an example, comprise hydrofluoric acid at 15 torr of partial pressure, alcohol at 0.01 torr and nitrogen at 60 torr. Thus, the part of the sacrificial layer 2 located beneath the structured part 20 is etched on its entire thickness. The structured part 20 is then suspended above the freed surface of the supporting layer 1, thus forming a cavity 3. The cavity 3 is therefore located between the structured part 20 and the free surface 4 of the supporting layer 1.

A suspended structured part 20 is thus obtained, whose tensioning arms 22 keep the central portion 21 above the free surface 4 of the supporting layer 1 and generate, in the central portion 21, an increase in initial tensile stress $\sigma_s^i$, along the strain axis or axes, owing to the difference in average width between the tensioning arms 22 and the central portion 21. In this example, the strain of the central portion 21 may be sufficient to obtain a direct electronic band structure of the layer of interest 12 located in the central portion 21.

The process thus makes it possible to obtain an increase in tensile stress of the central portion 21 of the semiconductor stack 10, and therefore produce a tensile strain of the layer of interest 12 located in the central portion 21, without having to produce an intermediate layer based on germanium-tin with a high proportion of tin, as described in the article of Wirths et al. 2013 mentioned above. The crystal quality of the semiconductor stack 10, and in particular that of the layer of interest 12 based on GeSn, may be preserved when the stack and its constituent layers have a thickness less than the respective critical thicknesses.

Figure 2A:
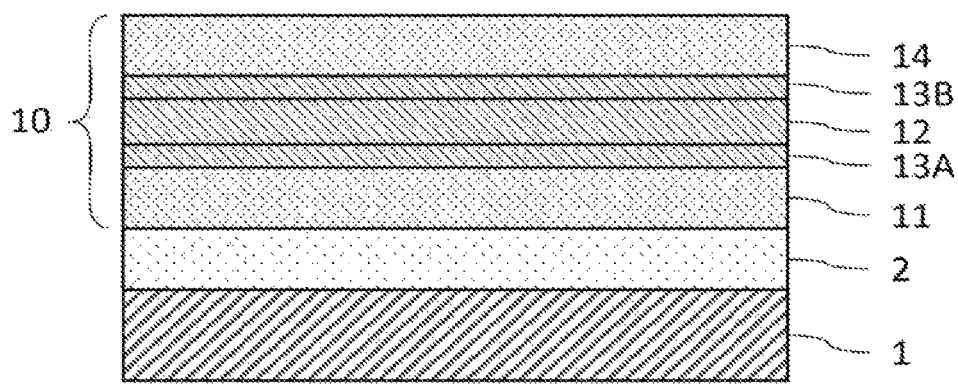
FIGS. 2A, 2B, 2C are schematic views, in section (FIG. 2A and 2B) and from above (FIG. 2C), of a variant of the stack illustrated in FIGS. 1A to 1C.
Figure 2B:
Figure 2B:
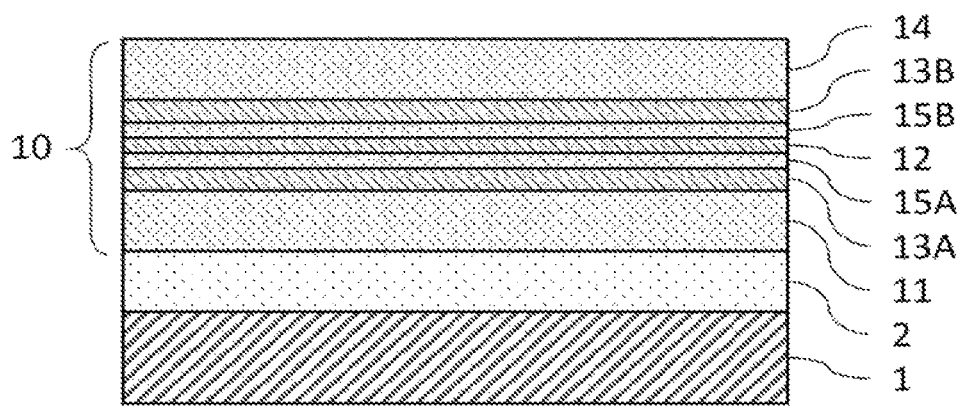
Figure 2C:
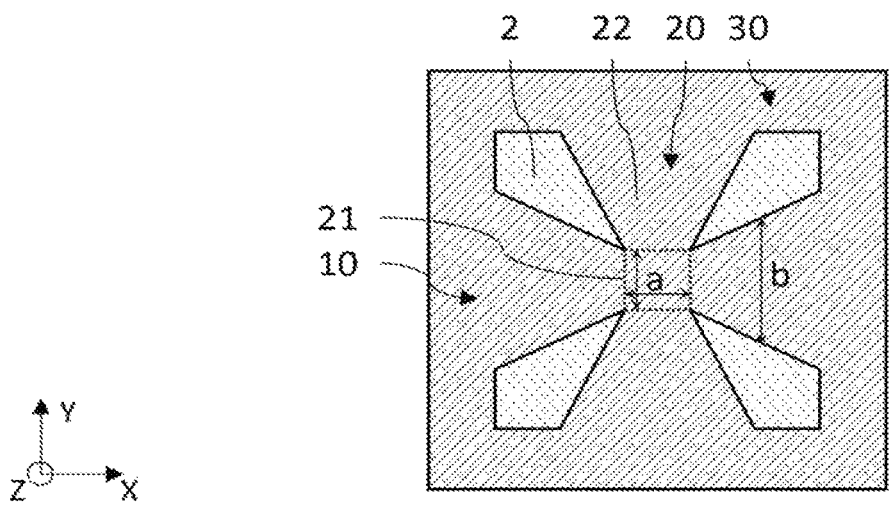

FIGS. 2A and 2B are schematic cross-sectional views of different variants of the stack illustrated in FIG. 1A, and FIG. 2C is a schematic top view of a variant of the structured part 20 illustrated in FIG. 1B.

In FIG. 2A, the stack 10 differs from that illustrated in FIG. 1A in that it further comprises two layers 13A, 13B based on germanium-tin GeSn between which the layer of interest 12 is located in contact. The layers 13A, 13B based on germanium-tin may be made of a germanium-tin binary alloy, or even ternary or quaternary, and may have an atomic proportion of tin identical to or different from that of the layer of interest 12. In this example, the layers 13, 13B are made of a material identical to that of the layer of interest 12, namely a germanium-tin binary alloy with the same atomic proportion of tin, and differ from it by the doping. In fact, here the layer of interest 12 is not intentionally doped whereas the lower layer 13A has doping according to a first type of conductivity, for example of n-type, and the upper layer 13B has doping according to a second type of conductivity opposite to the first type, for example of p-type. The doped layers 13A, 13B may have different thicknesses, here lower than that of the layer of interest 12. As an example, the thickness of the layer of interest 12 may be of about 350 nm and those of the doped layers 13A, 13B of about 100 nm. The doped layers 13A, 13B may form, with the layer of interest 12, a diode of the p-i-n type.

The stack 10 may further comprise an upper layer 14 intended to ensure balancing of the stresses along the Z axis of the semiconductor stack 10, with the aim of limiting the risks of overall deformation of the stack along the Z axis, of the buckling type. This upper layer 14 has a thickness, a Young's modulus and a tensile stress in the (X,Y) plane such that the vertical stress distribution along the Z axis is approximately symmetric. More precisely, a vertical stress distribution is called approximately symmetric when the semiconductor stack 10 is such that the sums $\Sigma_k E_k \varepsilon_{k,z} e_k$ relating to the layers located on either side of a mid-plane (parallel to the XY plane) of the stack 10 are equal to one another to within 10%. Preferably, the upper balancing layer 14 is made of the same material as the nucleation layer 11 and has a product, thickness times tensile stress, approximately equal to that of the nucleation layer 11. In this example, the nucleation layer 11 is made of germanium with a thickness of about 1 μm and has a tensile strain in the (X,Y) plane of about 0.2%. The upper balancing layer 14 is made of germanium with a thickness of 800 nm and has a tensile strain of about 0.25%.

In FIG. 2B, the stack 10 differs from that illustrated in FIG. 2A in that the layer of interest 12 is separated from the doped layers 13A, 13B by two intermediate, so-called barrier layers 15A, 15B which have a bandgap energy greater than that of the layer of interest 12, so as to improve the quantum confinement of the charge carriers in the layer of interest 12. The barrier layers 15A, 15B may be made of a material that is not intentionally doped, preferably of germanium or of a germanium-tin alloy, with an atomic proportion of tin less than that of the layer of interest 12. Of course, generally the semiconductor stack 10 may have more semiconductor layers, based or not based on germanium-tin, doped or not doped, and therefore may comprise several layers of interest 12.

In FIG. 2C, the structured part 20 differs from that illustrated in FIG. 1B in that two pairs of tensioning arms 22 of identical dimensions are shown, which makes it possible to generate a biaxial increase in the tensile strain of the central portion 21, in this case of approximately equal intensity along the two strain axes, here respectively parallel to the X and Y axes. As a variant, each pair of tensioning arms 22 may have different dimensions, so as to deform the central portion with a different intensity along each of the strain axes.

As a variant, the process may also comprise a step of partial etching of the nucleation layer 11, the etching being selective with respect to the layer of interest 12, in order to obtain a central portion 21 no longer comprising the nucleation layer 11. Thus, the central portion 21 may be formed essentially of the layer of interest 12, and, if applicable, doped layers 13A, 13B and optionally barrier layers 15A, 15B. This step of selective etching may be isotropic wet etching of the nucleation layer 11, for example with carbon tetrafluoride ($CF_4$). The etching time is adapted for etching the thickness of the nucleation layer 11, which may be of the order of half the width "a" of the central portion 21. Thus, at the end of this step of selective etching, the nucleation layer 11 is no longer present in the central portion 21 whereas it is still present at the level of the tensioning arms 22. The aforementioned upper balancing layer 14 may then be omitted since the central portion 21 does not comprise the nucleation layer 11: the vertical stress distribution along the Z axis is approximately symmetric.

Figure 3:
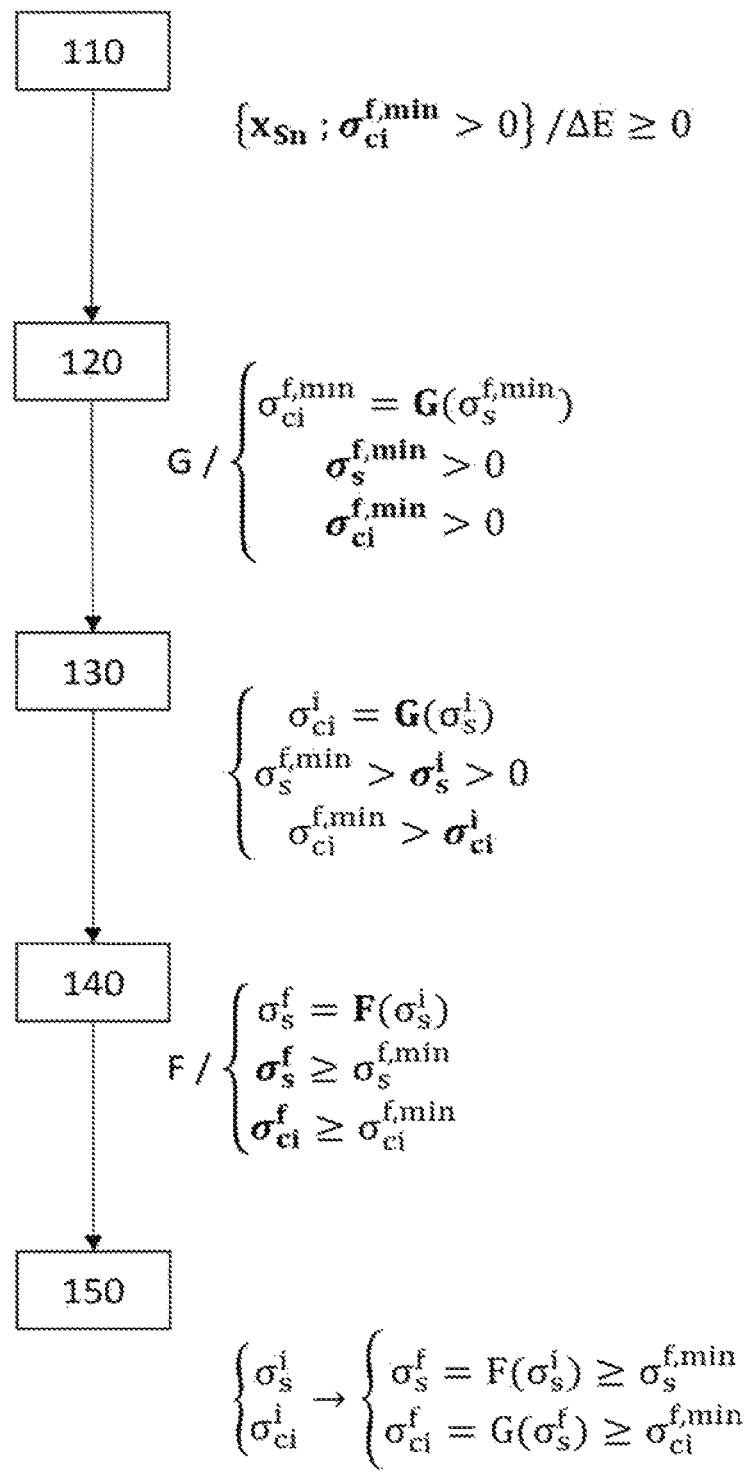
FIG. 3 illustrates a flowchart of a process according to a second embodiment, for obtaining a layer of interest with a direct electronic band structure.

FIG. 3 illustrates a flowchart of a process according to a second embodiment, for obtaining a layer of interest 12 based on germanium-tin with a direct electronic band structure.

In a first step 110, the minimum value $\sigma_{ci}^{f,min}$ of tensile stress for obtaining a direct electronic band structure is estimated for a layer of interest 12 based on germanium-tin $Ge_{1-x}Sn_x$ with an atomic proportion of tin $x_{Sn}$, in other words $\Delta E = E_{min,L} - E_{min,\Gamma} \geq 0$. The minimum value $\sigma_{ci}^{f,min}$ of tensile stress may be estimated on the basis of the article by Gupta et al. titled *Achieving direct band gap in germanium through integration of Sn alloying and external strain*, J. Appl. Phy., 113, 073707 (2013), which illustrates an example of variation of $\Delta E$ as a function of the value of the tensile stress acting on the layer of interest 12 of $Ge_{1-x}Sn_x$ and the atomic proportion of tin. This variation is determined on the basis of a non-local empirical pseudopotential method (NL-EPM).

In a second step 120, the semiconductor stack 10 comprising such a layer of interest 12 determined beforehand, with properties $\{x_{Sn}; \sigma_{ci}^{f,min}\}$, and having a tensile stress of value $\sigma_s^{f,min}$, is determined. The values $\sigma_s^{f,min}$ and $\sigma_{ci}^{f,min}$ in are positive provided the stress in the (X,Y) plane is in tension.

For this, the transfer function for determining the value $\sigma_{ci}^{f,min}$ of the layer of interest 12 from the value $\sigma_s^{f,min}$ of the semiconductor stack 10, in other words: $\sigma_{ci}^{f,min} = G(\sigma_s^{f,min})$, is designated G. The transfer function G is parameterized by the characteristics of different layers making up the semiconductor stack 10, namely the lattice parameters, the thicknesses of the layers and the respective Young modulus and Poisson modulus. Therefore the parameters of the transfer function G are determined, for example by numerical simulation using the COMSOL Multiphysics software, or by satisfying the following relation:

$$\sigma_{s,z}^{f,min} = \Sigma_{k=1}^N E_k \varepsilon_{k,z}^{f,min} e_k$$

In a third step 130, said previously determined semiconductor stack 10 is produced in such a way that:
the semiconductor stack 10 has an initial tensile stress as $\sigma_s^i > 0$ lower than the value $\sigma_s^{f,min}$, and so that
it comprises the layer of interest 12 with atomic proportion of tin $x_{Sn}$ and with a value of initial stress $\sigma_{ci}^i$ lower than $\sigma_{ci}^{min}$ in such a way that the band structure is indirect, and the initial value $\sigma_{ci}^i$ may be positive (in tension), zero or negative (in compression).

In a fourth step 140, structuring of the semiconductor stack 10 is determined so as to form the structured part 20 described above. The structuring is determined in such a way that suspension of the structured part 20 causes an increase in stress of the central portion 21, from the initial value $\sigma_s^i$ as to the final value $\sigma_s^f$, the latter then being greater than or equal to $\sigma_s^{f,min}$.

For this, the transfer function for passing from as $\sigma_s^i$ to $\sigma_s^f$ is designated F, in other words: $\sigma_s^f = F(\sigma_s^i)$. The transfer function F is parameterized essentially by the dimensions of the structured part 20, and notably by the average width of the tensioning arms 22 and of the central portion 21. The transfer function may be identical or similar to the amplification factor f mentioned above with reference to relation (2). Therefore the parameters of the transfer function F are determined, for example by numerical simulation using the COMSOL Multiphysics software or by satisfying the aforementioned relation (2).

In a fifth step 150, the structured part 20 is suspended by etching the sacrificial layer 2 located beneath the structured part 20. Thus, at the same time:
the central portion 21 of the stack passes from the initial value $\sigma_s^i$ to the final value $\sigma_s^f = F(\sigma_s^i)$ of stress in the (X,Y) plane, the final value $\sigma_s^f$ then being greater than or equal to $\sigma_s^{f,min}$;
the layer of interest 12 passes from the initial value $\sigma_{ci}^i$ to a final value $\sigma_{ci}^f = G(\sigma_s^f)$ of stress in the (X,Y) plane, this final value then being greater than or equal to $\sigma_{ci}^{f,min}$.

We thus obtain a layer of interest 12 based on germanium-tin, located at the level of the central portion 21, which has a direct electronic band structure, without having had to produce a tensioning layer with a high atomic proportion of tin as described in the article of Wirths 2013 cited above. It is then possible to obtain a direct electronic band structure for a layer of interest 12 based on GeSn having an atomic proportion of tin less than 14%, or even less than 10%, or even less than 8%, or even less. As before, the stack and the layers from which it is formed may have a crystal quality that is preserved when the respective thicknesses are less than the critical thicknesses.

Figure 4A:
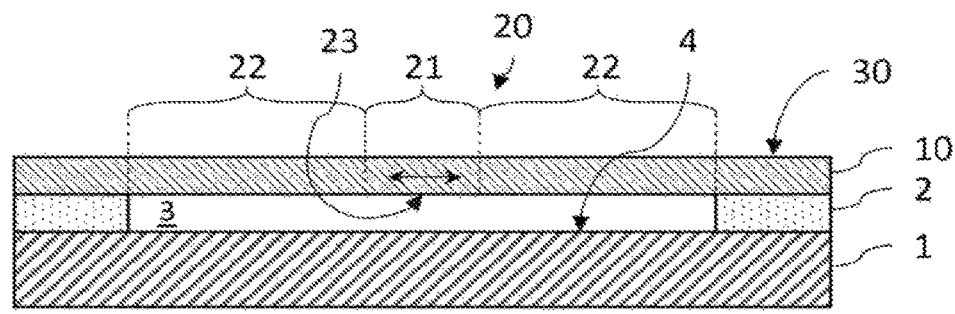
FIGS. 4A, 4B and 4C are schematic sectional views of a semiconductor structure for different steps of a process according to a third embodiment.
Figure 4B:
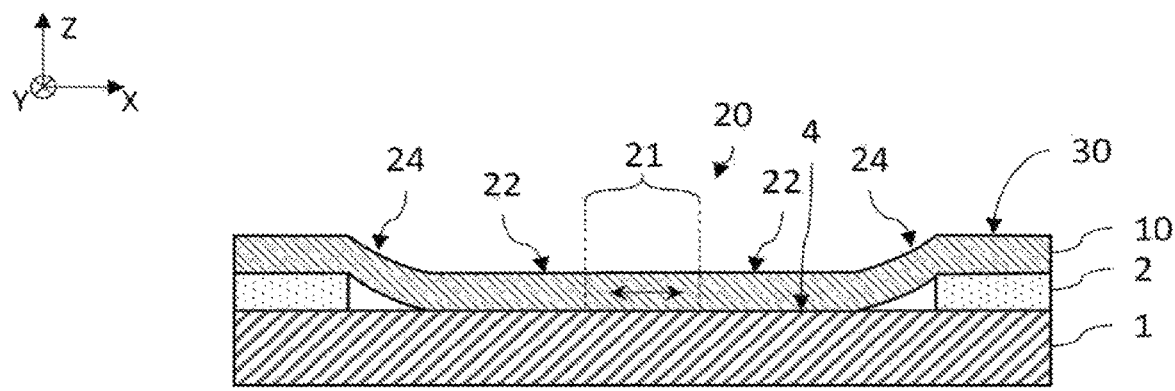
Figure 4C:
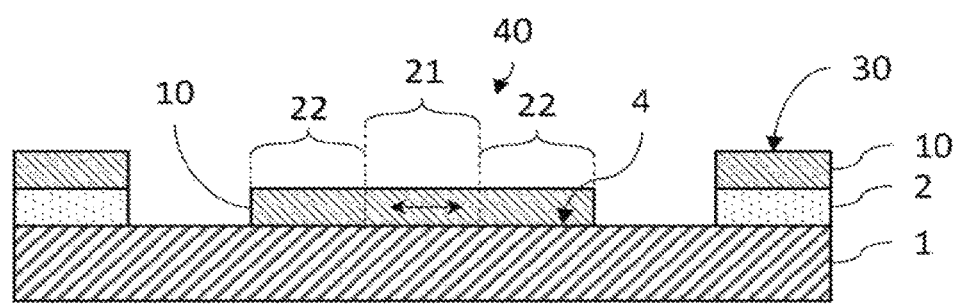

FIGS. 4A to 4C illustrate different steps of a process for producing a semiconductor structure 40 according to a third embodiment, the semiconductor structure 40 comprising the stack 10 with a layer of interest 12 based on germanium-tin described above, and being made integral by direct bonding on the supporting layer 1. This process is similar to that described in application FR1559283 filed on 30 Sep. 2015, which is incorporated here in its entirety by reference. Moreover, for clarity, only the semiconductor stack 10 is illustrated, but not the nucleation layer 11 and the layer of interest 12.

After the step of suspension described above, the central portion 21 of the semiconductor stack 10 is tensionally strained and then has elastic energy Ee, which, to a first order, may be written: $Ee \sim \sigma_s^f \cdot \varepsilon_s^f \cdot V$, where $\sigma_s^f$ is the mean value of the tensile stress in the (X,Y) plane, $\varepsilon_s^f$ is the mean value of the strain corresponding to the stress applied, and V is the volume of the central portion 21.

Direct bonding, also called molecular bonding or molecular adhesion bonding, means the integration of two surfaces of identical or different materials against one other, without supplying an adhesive layer (such as adhesive, glue, etc.), but by means of the attractive forces of atomic or molecular interaction between the surfaces to be bonded, for example van der Waals forces, hydrogen bonds, or even covalent bonds. The semiconductor stack 10, attached by direct bonding on the supporting layer 1, then has a bonding energy which, to a first order, may be written: $Ec \sim E_s \cdot S$, where $E_s$ is the bonding surface energy (it is assumed here that the surfaces to be bonded have an approximately equal surface energy) and S is the extent of the bonded surfaces.

As is described in detail hereunder, the molecular bonding used here may be of the hydrophilic or hydrophobic type. Bonding is of the hydrophilic type when it concerns the adherence of hydrophilic surfaces, i.e. surfaces having the capacity to bind to water molecules by an adsorption mechanism. Bonding then involves hydrogen bonding forces, which have a particularly high intensity of interaction. For this, the hydrophilic surfaces are terminated with hydroxyl groups (—OH). Alternatively, bonding may be of the hydrophobic type and then concerns surfaces that do not have the capacity to adsorb water. For this, the hydrophobic surfaces may be saturated with atoms such as hydrogen or fluorine.

For purposes of illustration, a process is described below for producing a semiconductor structure, comprising the stack with the layer of interest 12 based on germanium-tin located in the structured part 20, the semiconductor structure 40 being bonded by molecular adhesion to a supporting layer 1 of silicon.

According to a first step, a semiconductor stack 10 is produced comprising the structured part 20 (not shown), resting on the supporting layer 1 via a sacrificial layer 2.

The semiconductor stack 10 comprises the layer of interest 12 based on germanium-tin (not shown), and is identical or similar to the semiconductor stacks described above.

According to a second step illustrated in FIG. 4A, a cavity 3 is made underneath the structured part 20 so as to suspend it above a freed surface of the supporting layer 1. The semiconductor stack 10 then passes from the initial value $\sigma_s^i$ to the final value $\sigma_s^f$ of stress in the (X,Y) plane, the final value then being greater than or equal to $\sigma_s^{f,min}$. The layer of interest 12 passes from the initial value $\sigma_{ci}^i$ to a final value $\sigma_{ci}^f$ of stress in the (X,Y) plane, this final value preferably being greater than or equal to $\sigma_{ci}^{f,min}$, in such a way that the layer of interest 12 has a direct electronic band structure.

According to a third step illustrated in FIG. 4B, the structured part 20 is brought into contact with the free surface 4 of the supporting layer 1. For this, the structured part 20 may be immersed in a liquid solution, for example of alcohol or of acidified deionized water (pH close to 2), and then the liquid is evaporated. In the evaporation step, the structured part 20 comes into contact naturally with the free surface 4 of the supporting layer 1. Thus, the structured part 20 rests on the supporting layer 1, so that the lower surface of at least one part of the tensioning arms 22 is in contact with the free surface 4 of the supporting layer 1. The lower surface of the central portion 21 may be totally, partially, or not in contact with the free surface 4.

Bringing these surfaces into contact ensures direct bonding of the structured part 20 with the supporting layer 1, of the hydrophobic type here since the surfaces become attached to one another by means of hydrogen bonds. At room temperature, as illustrated by FIG. 5C, showing the variation of the surface energy of hydrophobic bonding between the bonded surfaces, the energy of hydrophobic bonding is in this case of the order of 5 mJ/m².

"Bringing into contact" means contact of the lower surface 23 of the structured part 20 with the free surface 4 of the supporting layer 1. These surfaces may be formed of the material mainly making up the layers or of an interposed material different from this main material. The structured part 20 and the supporting layer 1 may thus comprise a thin layer of an interposed material obtained for example by deposition or by oxidation, preferably after formation of the cavity 3. In the process described here, involving hydrophobic bonding, the structured part 20 and the supporting layer 1 do not comprise any interposed material.

Thus, a structured part 20 of the semiconductor stack 10 is obtained, bonded on the free surface 4 of the supporting layer 1. The bonded structured part 20 comprises the central portion 21 and a part of the tensioning arms 22. The non-bonded part of the tensioning arms 22 is located in the zone where the latter meets the peripheral part 30 of the semiconductor stack 10, the latter resting on the unetched part of the sacrificial layer 2.

As a variant, the step of suspension and of bringing the structured part 20 into contact with the free surface 4 of the supporting layer 1 may be carried out at the same time. For this, the cavity 3 is for example made by wet etching with liquid HF or even with HF vapor at high pressure. In the case of etching with HF vapor, the flow of vapor may comprise hydrofluoric acid at 60 torr of partial pressure, alcohol at 0.1 torr and nitrogen at 75 torr. The flow of gas then leads to a higher etching rate than that mentioned above, for example of the order of 100 nm/min, in a non-equilibrium etching reaction. Thus, drops of water and of hydrofluoric acid, produced by the chemical reaction, form in the cavity 3 and, on evaporating, cause the structured part 20 to come into contact with the free surface 4 of the supporting layer 1.

At the end of this step, the bonded structured part 20, formed from the central portion 21 and the tensioning arms 22 resting on the supporting layer 1, has:

a bonding energy Ec, resulting from hydrophobic molecular bonding on the supporting layer 1. It may be estimated, to a first order, from the relation:

$$E_c \approx E_s(S_{bt} + S_{pc})$$

where $E_s$ is the surface energy evaluated from the relation illustrated in FIG. 5C, and $S_{bt}$ and $S_{pc}$, are the respective bonded surfaces of the tensioning arms 22 and of the central portion 21. The bonding energy tends to stabilize the bonded structured part 20 and prevent any stress relaxation liable to alter its mechanical durability as well as its crystalline structure, and hence degrade its electrical and/or optical properties;

an elastic energy Ee, resulting from the tensile stress linked to the strain of the central portion 21 by the tensioning arms 22. It may be estimated, to a first order, by the relation:

$$E_e \approx e(\sigma_{s,bt}^f \cdot \varepsilon_{s,bt}^f \cdot S_{bt} + \sigma_{s,pc}^f \cdot \varepsilon_{s,pc}^f \cdot S_{pc})$$

where e is the mean thickness of the semiconductor stack 10, $\sigma_{s,bt}^f$ and $\sigma_{s,pc}^f$ are the mean values of the tensile stresses acting, respectively, on the tensioning arms 22 and the central portion 21, $\varepsilon_{s,bt}^f$ and $\varepsilon_{s,pc}^f$ are the mean values of the corresponding strains. The elastic energy tends to destabilize the bonded central part so as to relax the stresses naturally.

It may be noted that, to a first order, the bonding energy comprises a predominant term linked to the bonded surface of the tensioning arms 22, the latter is generally greater than the bonded surface of the central portion 21. Moreover, the elastic energy comprises a predominant term linked to the strain of the central portion 21, insofar as the tensioning arms 22 have a mean value of strain close to the value of residual strain, the latter being lower than the value of the strain to which the central portion 21 is subjected.

With the aim of producing a bonded semiconductor structure 40, whose mechanical durability and therefore the electrical and/or optical properties are preserved, which may be separated from the peripheral part 30, the bonding energy must be greater than the elastic energy, which is reflected to first order in the following inequality:

$$E_s^{min}(S_{bt}^{min}+S_{pc}) > e(\sigma_{s,bt} \cdot \varepsilon_{s,bt} \cdot S_{bt}^{min} + \sigma_{s,pc} \cdot \varepsilon_{s,pc} \cdot S_{pc})$$

For this, both the minimum value of bonding surface energy $E_s^{min}$ and the minimum value of bonded surface $S_{bt}^{min}$ of the tensioning arms 22, necessary for satisfying this inequality, are determined. Of course, this inequality may be stated using more detailed expressions for the bonding energy and elastic energy, for example by integrating the stress field in the whole volume of the bonded structured part 20.

According to a fourth step, the molecular bonding of the structured part 20 on the supporting layer 1 is reinforced, so as to obtain a value Es of bonding surface energy greater than or equal to the previously determined minimum value $E_s^{min}$. For this, a thermal treatment is carried out, in the form of consolidation annealing, in which the stack is subjected to an annealing temperature Tr for some minutes to some hours. As an illustration, the annealing temperature may be 200° C. applied for 2 h, which in this case increases the surface energy of hydrophobic bonding from 5 mJ/m² to 100 mJ/m². The annealing temperature is between a minimum value, which depends notably on the minimum bonded surface $S_{bt}^{min}$ of tensioning arms 22 that we wish to conserve, and a maximum value that depends notably on the crystal quality of the semiconductor stack 10 to be preserved. The maximum value of the annealing temperature may thus be below the temperature of epitaxial growth of the semiconductor stack 10. Thus, a structured part 20 is obtained, bonded to the supporting layer 1 with a bonding energy Ec whose value is greater than or equal to the predetermined minimum value. We are then able to remove a part of the tensioning arms 22 to separate the structured part 20 from the peripheral part 30.

In a fifth step illustrated in FIG. 4C, a distal portion 24 of the tensioning arms 22 is removed by etching, so as to separate, or individualize, the structured part 20 relative to the peripheral part 30. Here, "separate", "make separate" or "individualize" means that the structured part 20 is no longer joined to the peripheral part 30 by the tensioning arms 22. Moreover, distal portion 24 of the tensioning arms 22 relative to the central portion 21 means the zone of the tensioning arms 22 remote from the central portion 21 and forming the connection with the peripheral part 30. The distal portion of the tensioning arms 22 is removed by conventional operations of optical and/or electronic lithography and etching, so that the bonded structured part 20 comprises a value of bonded surface $S_{bt}$ of the tensioning arms 22 greater than or equal to the previously determined minimum value $S_{bt}^{min}$. Thus, the bonded surface of the tensioning arms 22 is sufficient for the bonded structured part 20 to have a bonding energy greater than its elastic energy. Thus, a semiconductor structure 40 is obtained with a central portion 21 bonded on the supporting layer 1 whose mechanical durability is assured, thus preserving its electrical and/or optical properties. The semiconductor structure 40 has a high crystal quality and the central portion 21 has a predetermined mean strain. It is made integral with the supporting layer 1 by molecular bonding, whose bonding energy and the bonded surface of the tensioning arms 22 make it possible to fix the stress field. In the central portion 21, the layer of interest 12 based on GeSn has a direct electronic band structure.

Figure 5A:
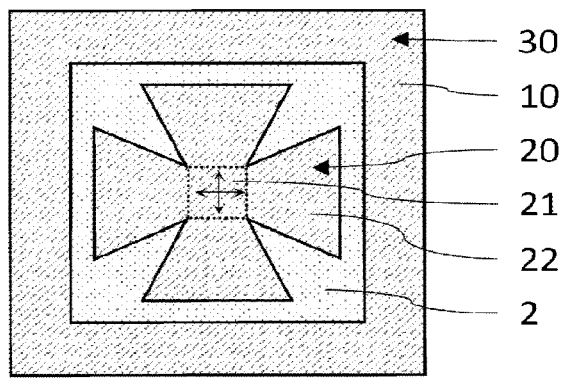
FIGS. 5A and 5B are schematic top views of a semiconductor structure, with and without a peripheral part, respectively.
Figure 5B:
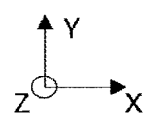
Figure 5B:
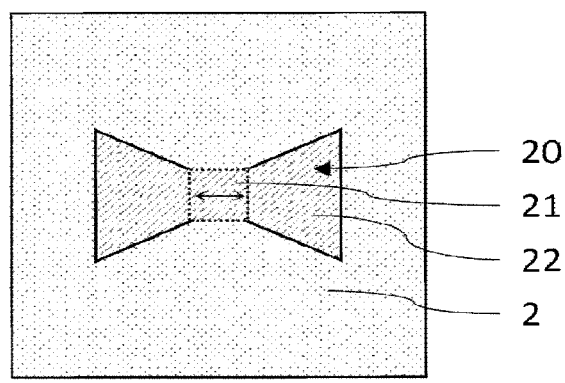
Figure 5C:
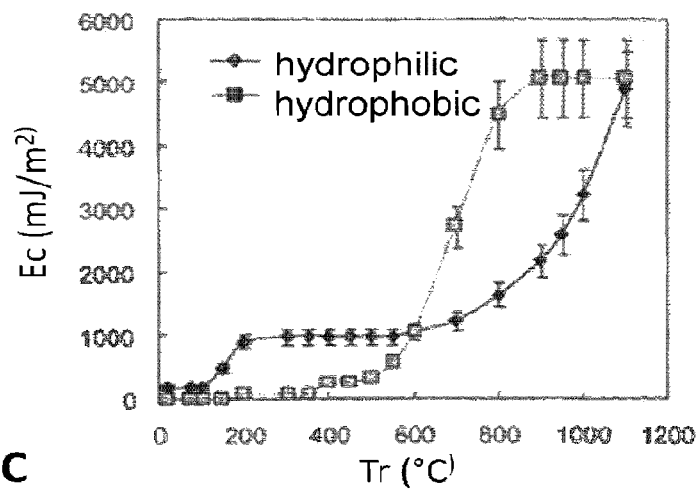
FIG. 5C is an example of the relation between the bonding surface energy as a function of the annealing temperature, for hydrophilic bonding and for hydrophobic bonding.

FIG. 5A illustrates the semiconductor structure 40 with a central portion 21, obtained by separating the structured part 20 from the peripheral part 30, by etching of the distal zone of the tensioning arms 22 making the connection to the peripheral part 30. FIG. 5B illustrates the semiconductor structure 40 obtained from the bonded structured part 20 by etching the zone connecting the tensioning arms 22 to the peripheral part 30 (the latter also being removed).

FIG. 5C illustrates an example of the relation between the bonding surface energy between a germanium surface of the nucleation layer 11 and a silicon surface of the supporting layer 1, as a function of the annealing temperature, in the case of bonding of the hydrophilic type and bonding of the hydrophobic type. Up to about 600° C., the bonding surface energy has a lower value in the hydrophobic case than in the hydrophilic case. The tendency is then reversed starting from about 600° C. Moreover, in the hydrophilic case, the surface energy increases once annealing at about 100° C. is applied, changing from energy of the order of 100 mJ/m² at room temperature to 1 J/m² after annealing at about 200° C. In the hydrophobic case, it changes from energy of the order of 5 mJ/m² at room temperature to 100 mJ/m² after annealing at about 200° C.

As a variant, according to a fourth embodiment described with reference to FIGS. 6A to 6C, it is possible to perform molecular bonding of the hydrophilic type for the structured part 20 on the supporting layer 1, by a process identical or similar to that described in application FR1559283 filed on 30 Sep. 2015 cited above.

Figure 6A:
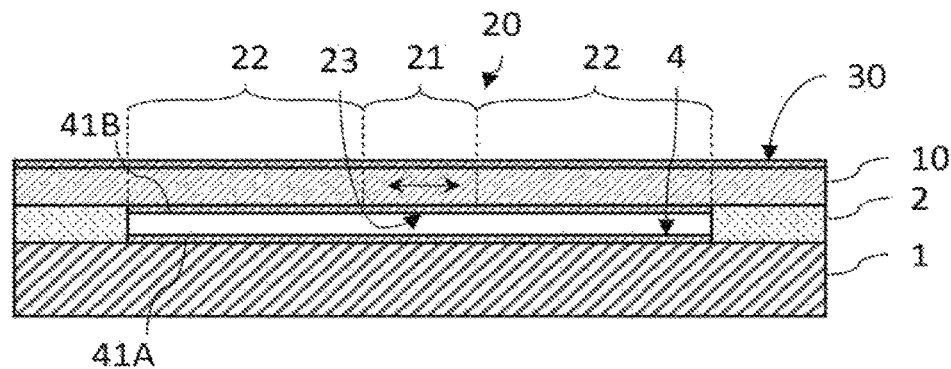
FIGS. 6A, 6B and 6C are schematic sectional views of a semiconductor structure, for different steps of a process according to a fourth embodiment involving a step of hydrophilic bonding.

Referring to FIG. 6A, prior to contacting the structured part 20 suspended on the supporting layer 1, a step of surface treatment of the structured part 20 and of the free surface 4 of the supporting layer 1 is carried out, with the aim of subsequently ensuring hydrophilic molecular bonding of these elements. In this step, the surface 23 of the structured part 20 opposite the cavity 3 and the free surface 4 of the supporting layer 1 are treated, in such a way that they are each formed from a thin layer 41A, 41B of oxide or nitride, with a thickness from some nanometers to some tens of nanometers.

According to one variant, the structured part 20 and the supporting layer 1 are covered, at the level of the cavity 3, with a so-called interposed thin layer 41A, 41B of oxide produced by oxidation, for example obtained by exposing this zone of the stack to the open air for a sufficient time, for example 1 h. They may also be obtained by an $O_3$ plasma oxidation technique, for example at room temperature, or even by an $O_2$ plasma oxidation technique, for example at a temperature 250° C. According to another variant, the thin layers of oxide or of nitride are obtained by a thin layer deposition technique, for example of the ALD (atomic layer deposition) type, whether or not plasma-assisted.

Figure 6B:
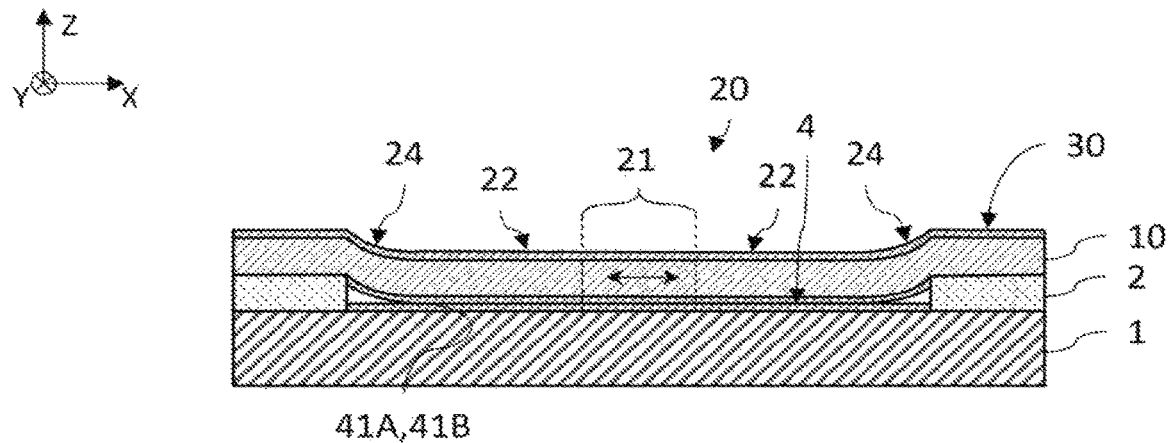

Referring to FIG. 6B, the structured part 20 is then brought into contact with the free surface 4 of the supporting layer 1, for example by immersing the structured part 20 suspended in a liquid solution, for example of alcohol or of acidified deionized water (pH close to 2), and then evaporating the liquid. Bringing these surfaces into contact ensures direct bonding of the hydrophilic type of the structured part 20 on the supporting layer 1 at the level of the respective interposed layers 41A, 41B. At room temperature, as illustrated in FIG. 5C, the energy of hydrophilic bonding is in this case of the order of 100 mJ/m². These interposed layers 41A, 41B have a thickness of the order of some tens of nanometers to one or more hundreds of nanometers, and are advantageously dielectric and can provide electrical insulation of the central portion 21 with respect to the supporting layer 1.

Next there is a step of determining the minimum value of bonding surface energy $E_s^{min}$, here hydrophilic, and the minimum value of bonded surface $S_{bt}^{min}$ of the tensioning arms 22, necessary for the energy of hydrophilic bonding of the structured part 20 to be greater than the elastic energy of this same structured part 20.

This is then followed by a step of reinforcement of the molecular bonding of the structured part 20 attached to the supporting layer 1, so as to obtain a value Es of surface energy of hydrophilic bonding greater than or equal to the previously determined minimum value $E_s^{min}$. For this, a thermal treatment is carried out, in the form of consolidation annealing, in which the stack is subjected to an annealing temperature Tr for some minutes to some hours. As an illustration, the annealing temperature may be 200° C. applied for 2 h, which in this case increases the surface energy of hydrophilic bonding from 100 mJ/m² to 1 J/m².

Figure 6C:
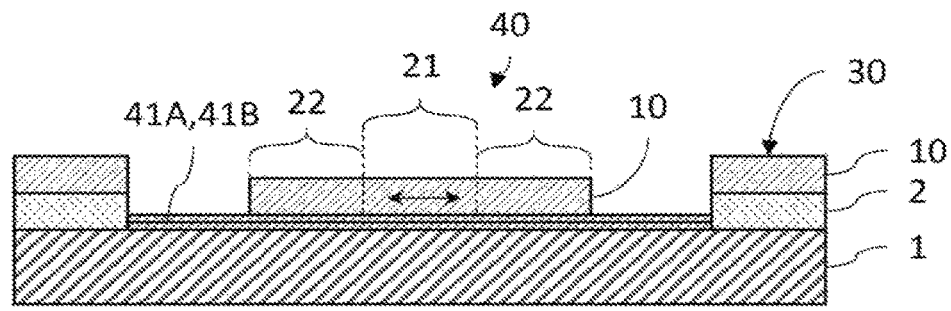

Referring to FIG. 6C, a distal part 24 of the tensioning arms 22 is removed by etching, so as to individualize the structured part 20 with respect to the peripheral part 30. This step is similar to the step described above with reference to FIG. 5C and is not described in more detail here. Thus, a semiconductor structure 40 is obtained with a central portion 21 bonded by hydrophilic molecular adhesion on the supporting layer 1, whose mechanical durability is ensured and the electrical and/or optical properties are preserved. The middle layer comprises the layer of interest 12 based on GeSn, the band structure of which is advantageously direct.

The process according to this embodiment therefore differs from the process described above essentially by the hydrophilic bonding, the intensity of which is greater than that of the hydrophobic bonding up to annealing temperatures of the order of 500° C. to 600° C., and by the presence of an interposed layer 41A, 41B of an oxide or nitride at the interface between the structured part 20 and the supporting layer 1, whose dielectric property provides electrical insulation between these elements. This interposed material, besides a function of electrical insulation, may also provide a function of removal of any heat produced at the level of the central portion 21, in the case when the latter forms an emitting layer of a light source.

Advantageously, a plurality of semiconductor structures 40 may be produced collectively and simultaneously, starting from the same semiconductor stack 10. The semiconductor structures are then adjacent and separated from one another. Thus, each semiconductor structure 40 is separate from its neighbors, i.e. not attached to the corresponding peripheral part 30 of the same semiconductor stack 10.

The production of various optoelectronic devices comprising the semiconductor structure 40 with a layer of interest 12 based on tensionally strained germanium-tin, obtained by one or other of the processes described above, will now be described.

Figure 7A:
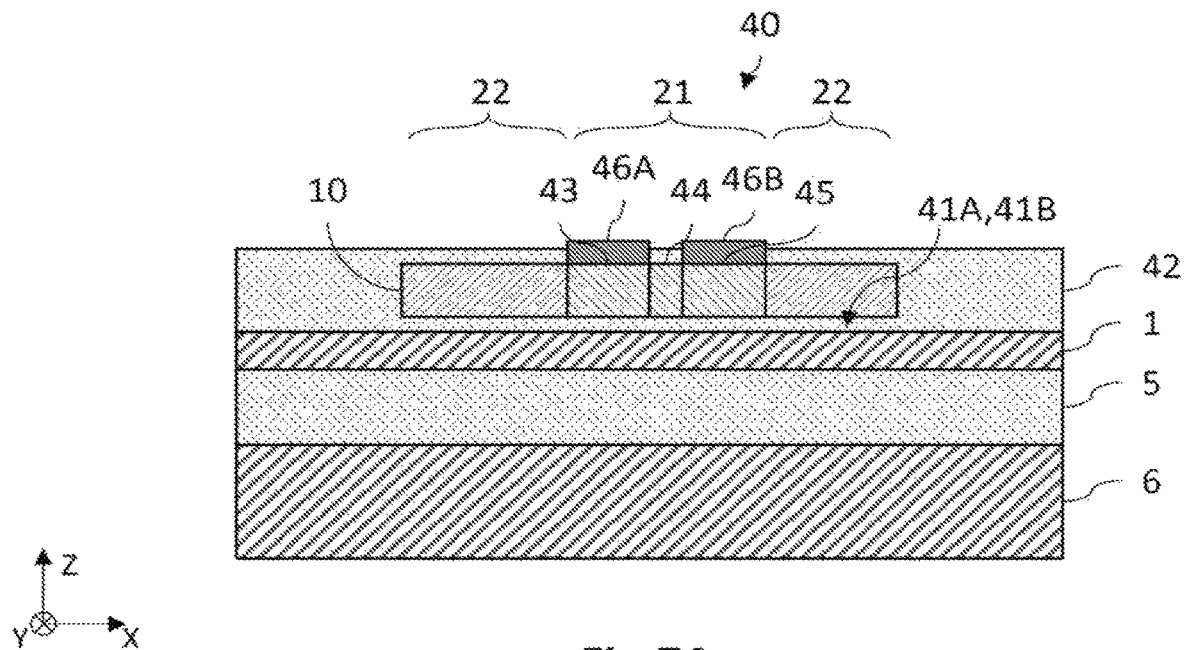
FIGS. 7A and 7B are schematic sectional views of an optoelectronic device for emitting incoherent light comprising a semiconductor structure obtained by the process according to the fourth embodiment.
Figure 7B:
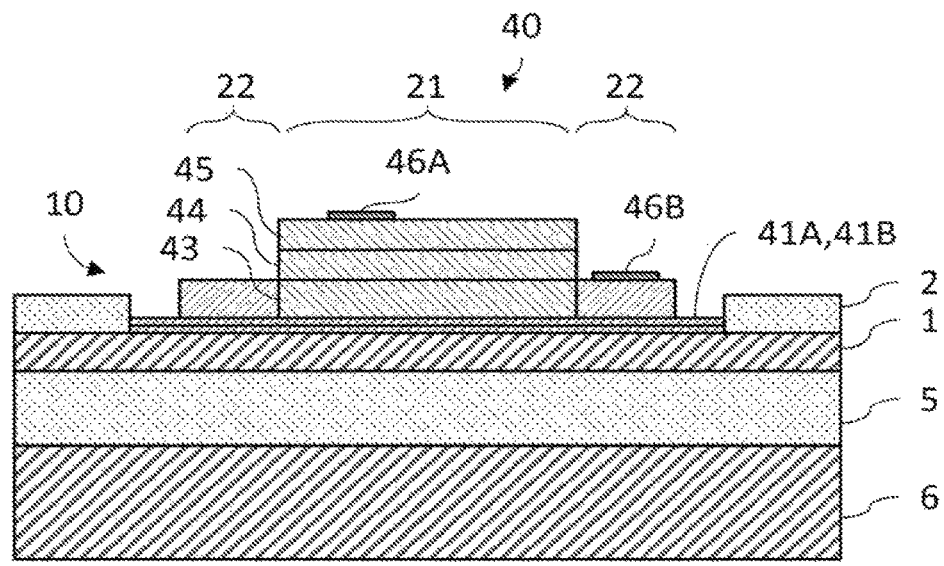

FIGS. 7A and 7B show schematic sectional views of two examples of an optoelectronic device for emitting incoherent light. The optoelectronic device is in this case a light-emitting diode.

In FIG. 7A, the light-emitting diode in this case comprises a semiconductor structure 40 obtained by the production process according to the fourth embodiment, i.e. involving hydrophilic molecular bonding.

The semiconductor structure 40 comprises a central portion 21 in tension in which the layer of interest 12 based on GeSn (not shown) preferably has a direct electronic band structure. It is attached to the supporting layer 1 by hydrophilic molecular bonding, which is reflected in the presence of an interposed material 41A, 41B, here a silicon oxide, located at the interface between the germanium of the nucleation layer 11 (not shown) of the semiconductor stack 10 and the silicon supporting layer 1. The supporting layer 1 is in this case an upper silicon layer of a substrate, for example of the SOI type. It rests on a layer of oxide 5 located between the supporting layer 1 and a thick lower layer 6 of silicon.

The semiconductor structure 40 further comprises an encapsulation layer 42 that covers the central portion 21 and the tensioning arms 22. This encapsulation layer 42 may be made of a dielectric material having good thermal conductivity, such as $Al_2O_3$ or $Si_3N_4$. $Si_3N_4$ may, moreover, help to induce a tensile stress in the semiconductor stack 10. The central portion 21 comprises a p-i-n junction produced by implantation of dopants (phosphorus and boron) so as to form an n-doped zone 45 close to a p-doped zone 43. Here, an intrinsic zone 44 (not intentionally doped) separates the n-doped and p-doped zones. The p-i-n junction extends approximately vertically across the central portion 21 and therefore the layer of interest 12 based on GeSn (not shown), towards the supporting layer 1. Moreover, two studs 46A, 46B of an electrically conducting material are present at the level of the doped zones, forming electrical contacts.

The light-emitting diode may be obtained in the following way. First, the semiconductor stack 10 is produced according to the second embodiment in such a way that the layer of interest 12 based on GeSn has a direct electronic band structure, and then the semiconductor structure 40 is produced by the process according to the fourth embodiment (hydrophilic bonding). Then the doped zones 43, 45 are produced by implantation of impurities, for example phosphorus and boron. The electrical contacts 46A, 46B are then produced. An encapsulation layer 42 is deposited and then smoothed by a mechanical-chemical polishing technique of the CMP (chemical mechanical polishing) type and then etched locally so as to make the electrical contacts accessible.

FIG. 7B illustrates a variant of the light-emitting diode illustrated in FIG. 7A, which differs from it essentially in that a p-i-n junction extends approximately parallel to the plane of the supporting layer 1.

The central portion 21 is structured in its thickness, so as to have a lower part 43 based on GeSn doped according to a first type of conductivity, here of p-type, based on the nucleation layer 11 (not shown). This p-doped part 43 is connected to the tensioning arms 22 and has a mean thickness roughly identical to that of the arms. An upper part 45 based on GeSn doped according to a second type of conductivity, here of the n-type, rests on the p-doped lower part. An intrinsic part 44 based on GeSn is located between the n-doped upper part 45 and the p-doped lower part 43, and in this case has dimensions in the (X,Y) plane roughly identical to those of the upper part. The intrinsic part 44 corresponds advantageously to the layer of interest 12 with a direct electronic band structure (not shown). Thus, the p-doped and n-doped parts 43, 45 and the intrinsic part 44 together form a p-i-n junction that extends in a plane approximately parallel to the (X,Y) plane. Two studs 46A, 46B of an electrically conducting material, forming electrical contacts, are arranged on the n-doped upper part and on a free zone of the p-doped lower part.

Figure 8A:
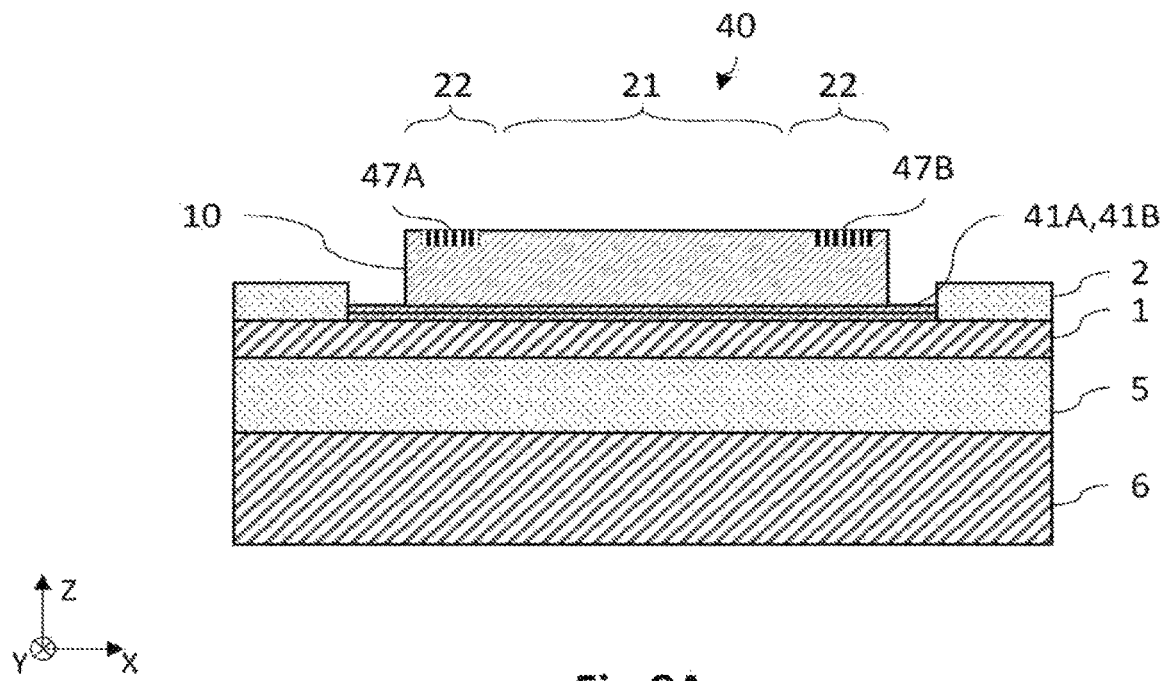
FIGS. 8A and 8B are schematic sectional views of an optoelectronic device for emitting coherent light comprising a semiconductor structure obtained by the process according to the fourth embodiment.
Figure 8B:
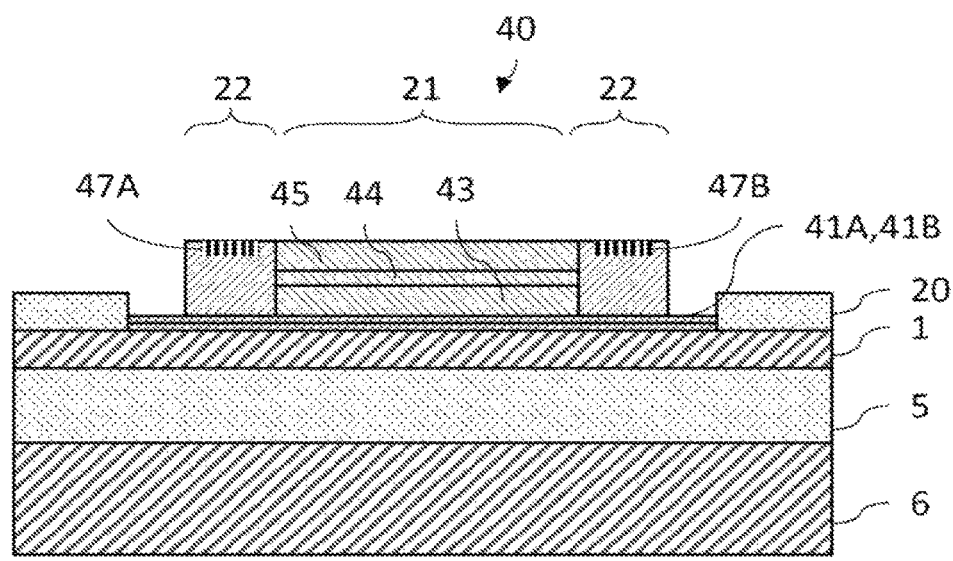

FIGS. 8A and 8B show a schematic sectional view of the examples of an optoelectronic device for emitting coherent light. More precisely, the optoelectronic device is in this case an optically or electrically pumped laser source.

In FIG. 8A, the laser source in this case comprises a semiconductor structure 40 obtained by the production process according to the fourth embodiment, i.e. involving hydrophilic molecular bonding. The laser source in this case comprises a semiconductor structure 40 formed from a central portion 21 of the stack 10 in tension with a layer of interest 12 based on GeSn (not shown) with an advantageously direct electronic band structure, and made integral with the supporting layer 1 by hydrophilic molecular bonding.

Here, the layer of interest 12 of the semiconductor structure 40 is intrinsic or even doped, for example with phosphorus to populate the indirect valley of the conduction band, and an optical cavity is produced, inside which the central portion 21 is located, which in this case forms a gain medium able to emit light. For this, and for purposes of illustration, two Bragg mirrors 47A, 47B are arranged on the upper face of the tensioning arms 22, preferably in a zone where the strain of the tensioning arms 22 is approximately equal to the residual value.

FIG. 8B illustrates a variant of the light-emitting diode illustrated in FIG. 8A, which differs from it essentially in that a p-i-n junction extends approximately parallel to the plane of the supporting layer 1 in the central portion 21. The central portion 21 in this case comprises a stack of a first lower part 43 based on GeSn, located near the supporting layer 1 (and separated from the latter by the nucleation layer 11), doped according to a first type of conductivity, for example of p-type, covered with an intrinsic intermediate part 44 corresponding to the layer of interest 12 (not shown), itself covered with an upper part 45 based on GeSn doped according to a second type of conductivity opposite to the first type, for example n-type. An optical cavity, similar to that described with reference to FIG. 8A, is made at the level of the upper face of the tensioning arms 22. Moreover, two electrical contacts (not shown) are provided to be in contact, one with the n-doped upper part, and the other with the p-doped lower part.

FIGS. 9A to 9F show schematic sectional views of different steps of an example of a process for producing a laser source in which the optical cavity is made at the level of the supporting layer 1.

In this example, a layer of a semiconductor material 8, here of germanium, is produced, for example by RP-CVD (reduced-pressure chemical vapor deposition) epitaxy, on a silicon substrate 7 (FIG. 9A). Then the germanium layer 8 is covered with a layer of oxide 9 and then H+ ions are implanted in the germanium layer 8 (dotted line in FIG. 9B). Then a silicon layer 1 is produced, intended to form the supporting layer 1, here in the form of a SOI substrate, in which two Bragg mirrors 47A, 47B (or equivalent optical elements) are produced at the level of its surface, intended to form an optical cavity. The surface of the supporting layer 1 is then covered with a layer of oxide. The SOI substrate is attached to the surface of the layer of oxide 9 (FIG. 9C). The germanium layer 8 is fractured at the level of the ion implantation zone and we thus obtain an assembly of a layer of germanium forming the nucleation layer of the stack 10, bound to a silicon supporting layer 1 via a sacrificial layer 2 of silicon oxide. The two Bragg mirrors 47A, 47B are buried in the supporting layer 1 at the level of the interface with the sacrificial layer 2 (FIG. 9D).

Then the semiconductor stack 10 is produced according to the first or second embodiment, comprising a layer of interest 12 based on GeSn (not shown) preferably with direct electronic band structures. Then a semiconductor structure 40 is obtained on the basis of the process according to the second embodiment. The Bragg mirrors are thus arranged opposite the tensioning arms 22, or even opposite the central portion 21, and surround the central portion 21 so as to form an optical cavity (FIG. 9E). Then an encapsulation layer 42 is deposited, for example of silicon oxide, which covers the semiconductor structure 40. Finally a p-i-n junction 43, 44, 45 is produced through the middle layer 21 and therefore the layer of interest 12 (not shown), and then electrical contacts 46A, 46B are made (FIG. 9F). Moreover, the supporting layer 1 may have been structured beforehand so as to form the core of a waveguide surrounded by a sheath formed from silicon oxide; the core extends roughly opposite the central portion 21.

Particular embodiments have just been described. Different variants and modifications will be apparent to a person skilled in the art.

Thus, the optoelectronic devices described above are only described by way of illustration. Other optoelectronic devices may be produced, for example optically or electrically pumped laser sources, with or without p-n, p-i-n junctions, or light-emitting diodes or photodetectors.

The invention claimed is:

1. A process for producing a tensionally strained layer based on germanium-tin, the process comprising:
   a) producing a semiconductor stack resting on a supporting layer via a sacrificial layer, said semiconductor stack comprising a nucleation layer and a layer based on germanium-tin grown epitaxially from the nucleation layer, said semiconductor stack having a non-zero initial value of tensile stress;
   b) structuring said semiconductor stack so as to form:
      a structured part and a peripheral part, the structured part comprising a central portion joined to the peripheral part by at least two lateral portions opposite one another with respect to the central portion, and
      the lateral portions having an average width b greater than an average width of the central portion; and
   c) suspending the structured part by etching the sacrificial layer located beneath the structured part, the suspended central portion then having a final value of tensile stress greater than the initial value
   wherein, prior to the producing a),
      estimating a value of atomic proportion of tin and a first minimum value of tensile stress for which the layer based on germanium-tin has a direct electronic band structure;
      determining the semiconductor stack comprising the nucleation layer and said estimated layer based on germanium-tin, and having a second minimum value of tensile stress;
      producing said semiconductor stack in such a way that it has said non-zero initial value of tensile stress and so that the layer based on germanium-tin has an initial value lower than said first minimum value;

determining the structuring in such a way that, after suspending c), the central portion of the structured part has a final value of tensile stress greater than or equal to said second minimum value, said layer based on germanium-tin then having a final value of tensile stress greater than or equal to said first minimum value and then having a direct electronic band structure.

2. The process as claimed in claim 1, wherein the nucleation layer is made of a semiconductor compound having a natural lattice parameter lower than that of the material of the layer based on germanium-tin.

3. The process as claimed in claim 1, wherein the semiconductor stack comprises at least one layer located between the layer based on germanium-tin and the nucleation layer and made of a semiconductor compound having a natural lattice parameter less than or equal to that of the material of the layer based on germanium-tin.

4. The process as claimed in claim 1, wherein the semiconductor stack has a thickness less than a critical thickness.

5. The process as claimed in claim 1, wherein each layer of the semiconductor stack has a thickness less than a critical thickness.

6. The process as claimed in claim 1, wherein the semiconductor stack comprises an upper and a lower layers based on germanium-tin, which are doped according to different types of conductivity] and located on either side of the layer based on germanium-tin, which is not doped intentionally.

7. The process as claimed in claim 6, wherein, between the upper and lower doped layers on the one hand and the layer based on germanium-tin on the other hand, there is at least one barrier layer based on germanium, or based on germanium-tin whose atomic proportion of tin is lower than an atomic proportion of tin in the layer based on germanium-tin.

8. The process as claimed in claim 1, wherein an atomic proportion of tin in the layer based on germanium-tin is below 10%.

9. The process as claimed in claim 1, further comprising contacting the structured part with a freed surface of the supporting layer, so as to make the structured part integral with the supporting layer by molecular bonding.

10. The process as claimed in claim 9, further comprising:
determining a minimum value of molecular bonding energy of the structured part on the supporting layer, as well as a minimum value of bonded surface area of the lateral portions, these minimum values being such that said energy of molecular bonding is greater than an elastic energy of the structured part;
consolidation annealing at an annealing temperature such that the energy of molecular bonding has a value greater than or equal to said previously determined minimum value; and then
etching a distal part of the lateral portions with respect to the central portion, in such a way that the bonded surface of the lateral portions has a value greater than or equal to said previously determined minimum value.

11. The process as claimed in claim 10, wherein said suspending and said contacting are carried out by etching the sacrificial layer with HF in a vapor phase optionally followed by deposition and then evaporation of a liquid between the suspended structured part and the supporting layer, and
in said consolidation annealing, the annealing temperature is greater than or equal to 200° C.

12. The process as claimed in claim 10, wherein,
in said suspending, oxidation or nitriding of a freed surface of the supporting layer as well as of a lower surface of the structured part oriented towards the free surface is performed, and
in said consolidation annealing, the annealing temperature is greater than or equal to 100° C.

13. The process as claimed in claim 12, wherein, at the end of said suspending, dielectric layers resulting from the oxidation or nitriding are formed at the level of the structured part and of the supporting layer.

14. A process for producing a microelectronic or an optoelectronic device comprising a tensionally strained layer based on germanium-tin obtained by the process as claimed in claim 1, the process comprising:
producing a p-n junction in the tensionally strained layer, or a p-i-n junction at the level of the tensionally strained layer, the latter then not being doped intentionally.

* * * * *

UNITED STATES PATENT AND TRADEMARK OFFICE
CERTIFICATE OF CORRECTION

PATENT NO. : 10,699,902 B2  
APPLICATION NO. : 16/327520  
DATED : June 30, 2020  
INVENTOR(S) : Vincent Reboud et al.

Page 1 of 1

It is certified that error appears in the above-identified patent and that said Letters Patent is hereby corrected as shown below:

In the Claims

In Column 20, Line 42, Claim 1, delete "epitaxi ally" and insert -- epitaxially --.

Signed and Sealed this  
Twenty-second Day of September, 2020

Andrei Iancu  
*Director of the United States Patent and Trademark Office*